United States Patent
Kaviani et al.

(10) Patent No.: US 7,479,814 B1
(45) Date of Patent: Jan. 20, 2009

(54) CIRCUIT FOR DIGITAL FREQUENCY SYNTHESIS IN AN INTEGRATED CIRCUIT

(75) Inventors: Alireza S. Kaviani, San Jose, CA (US); Maheen A. Samad, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 31 days.

(21) Appl. No.: 11/169,818

(22) Filed: Jun. 29, 2005

(51) Int. Cl.
G11C 8/00 (2006.01)
H03L 7/06 (2006.01)

(52) U.S. Cl. .................. 327/156; 326/158; 326/141; 326/105

(58) Field of Classification Search .................. 327/105, 327/156–158, 147–149, 141
See application file for complete search history.

(56) References Cited

U.S. PATENT DOCUMENTS

| | | | |
|---|---|---|---|
| 5,510,740 A * | 4/1996 | Farrell et al. | ................. 327/142 |
| 6,384,647 B1 | 5/2002 | Logue | |
| 6,621,762 B1 * | 9/2003 | Roohparvar | ................. 365/233 |
| 6,756,822 B1 | 6/2004 | Kaviani | |
| 6,838,918 B1 | 1/2005 | Kaviani | |
| 6,847,240 B1 | 1/2005 | Zhou | |
| 7,071,751 B1 | 7/2006 | Kaviani | |
| 7,081,780 B2 * | 7/2006 | Briggs et al. | ................. 327/143 |
| 7,190,196 B1 | 3/2007 | Kaviani | |

OTHER PUBLICATIONS

Kavaiani A.S. et al. "Circuit for Digital Frequency Synthesis in an Integrated Circuit", U.S. Appl. No. 11/169,818, filed Jun. 29, 2005, 29 pgs. available from Xilinx, Inc. 2100 Logic Dr., SJ, CA 95124.

Samad et al., "Circuit for and Method of Generating a Frequency Aligned Clock Signal", U.S. Appl. No. 11/169,461, filed Jun. 29, 2005, 22 pgs. available from Xilinx, Inc. 2100 Logic Dr., SJ, CA 95124.

Samad, Maheen A., "A Circuit for and Method of Changing a Frequency in a Circuit", U.S. Appl. No. 11/170,020, filed Jun. 29, 2005, pp. 30, available from Xilinx, Inc., 2100 Logic Drive, San Jose, CA 95124.

Kaviani, Alireza S., "Phase Alignment Using Asynchronous State Machines", Apr. 19-23, 2004, 86-94 pages, 10th International Symposium on Axynchronous Circuits and Systems (ASYNC'04), ISSN:1522-8681/04, 2004 IEEE.

U.S. Appl. No. 11/360,327, filed Feb. 22, 2006, Samad, Maheen A., entitled, "A Method of Generating an Output of a Frequency Synthesizer", 32 pgs. available from Xilinx, Inc. 2100 Logic Dr., SJ, CA 95124.

U.S. Appl. No. 11/360,321, filed Feb. 22, 2006, Samad, Maheen A., entitled, "A Method of and Circuit for Sampling a Frequency Difference in an Integrated Circuit", 33 pgs. available from Xilinx, Inc. 2100 Logic Dr., SJ, CA 95124.

* cited by examiner

*Primary Examiner*—Dinh T. Le
(74) *Attorney, Agent, or Firm*—John J. King

(57) ABSTRACT

A circuit for frequency synthesis in an integrated circuit is described. The circuit comprises an oscillator circuit having a counter-controlled delay line. A delay register is coupled to the counter-controlled delay line. The delay register stores a delay value for the counter-controlled delay line. Finally, a phase synchronizer circuit, coupled to the oscillator circuit, controls the starting and stopping of the oscillator circuit. According to alternate embodiments, a control circuit is coupled to the oscillator circuit for changing the frequency synthesizer from a low frequency mode to a high frequency mode.

20 Claims, 8 Drawing Sheets

CIRCUIT FOR DIGITAL FREQUENCY SYNTHESIS IN AN INTEGRATED CIRCUIT

FIELD OF THE INVENTION

The present invention relates generally to clock signals, and in particular, to a method of and circuit for frequency synthesis in an integrated circuit.

BACKGROUND OF THE INVENTION

Clock signals are used for a variety of purposes in digital circuits, both on board level systems and integrated circuit (IC) devices. An integrated circuit such as a programmable logic device (PLD) typically receives one or more external reference clock signals to generate one or more internal clock signals to operate internal digital circuits. In synchronous systems, global clock signals are used to synchronize various circuits across the board or IC device. For example, internal circuits could be clocked by a first clock signal at a first clock frequency, while input/output (I/O) circuits are clocked by a second clock signal at a second clock frequency. As the complexity of digital systems increases, clocking schemes continue to become more complicated.

While multiple clock generating circuits could be used to generate the multiple clock signals, clock generating circuits typically consume a large amount of chip or board space. Therefore, most systems use one clock generating circuit to generate a first clock signal called a reference clock signal, and a specialized circuit to derive other clock signals from the reference clock signal. For example, clock dividers are used to generate one or more clock signals of lower clock frequencies from the reference clock signal. Typically, clock dividers divide the frequency of the reference clock signal by an integer value. Conversely, clock multipliers are used to generate one or more clock signals of higher clock frequencies from the reference clock signal. Combining clock multipliers with clock dividers provides clock circuits which can generate one or more clock signals having frequencies that are fractional values of the frequency of the reference clock signal, commonly called frequency synthesis. For example, if the generated clock frequency is 7/5 of the reference clock frequency, then the two clock edges should be in concurrence every 7 cycles of the generated clock signal and every 5 cycles of the reference clock signal.

However, these internal clock signals must be carefully controlled to ensure proper timing in the integrated circuit. It is important for proper operation of the integrated circuit device that a generated clock signal be maintained accurately at the specified phase and frequency. This is often done by assuring that the phase of the generated clock signal coincides with that of the reference clock signal when concurrence should occur. Clock management circuits are used in integrated circuits to perform such functions as deskewing, shifting, as well as frequency synthesis. Traditionally, frequency synthesis is done using Phase-Locked Loops (PLLs) that control the phase and frequency by adjusting an analog voltage. Since using analog voltages increases the sensitivity to noise, fully-digital solutions are attractive for on-chip integration.

Delay-locked loops (DLLs) are also used to manage the propagation delay of the clock signals by using a delay line. If the delay line in the oscillator is voltage-controlled, analog circuits adjust the frequency by adjusting the voltage applied to the delay line (i.e. voltage-controlled delay elements). In an oscillator based on a tap-controlled delay (TCD) line, a number of delay elements in a delay line is used to control the frequency, where the number of the delay elements in a TCD is dictated by the lowest frequency range. A delay-locked loop can be used with a digital frequency synthesizer to maintain the phase between the input clock and the output clock generated by the digital frequency synthesizer.

Digital frequency synthesizers often have low and high frequency operating modes. These operating modes, which define both input and output frequency restrictions, must be selected by a user. In order for the digital frequency synthesizer to generate an output signal, the digital frequency synthesizer must lock on the reference signal. However, if the reference signal is not within the range of input signals selected by the user, the frequency synthesizer will not lock on reference signal and will not generate the desired synthesized clock signal. Further, a conventional tap-controlled delay line may be sensitive to environmental and operating conditions such as process variations, voltage, temperature, and noise. Tap-controlled delay lines can also occupy a large amount of area, and may introduce duty cycle distortion. Finally, conventional frequency synthesis circuits often require clocks in different clock domains to provide course and fine searching to lock to a reference clock.

Accordingly, there is a need for a method of and circuit for efficiently generating a clock signal in an integrated circuit.

SUMMARY OF THE INVENTION

In an embodiment of the present invention a circuit for frequency synthesis in an integrated circuit is described. The circuit comprises an oscillator circuit having a counter-controlled delay line. A delay register is coupled to the counter-controlled delay line. The delay register stores a delay value for the counter-controlled delay line. Finally, a phase synchronizer circuit, coupled to the oscillator circuit, controls the starting and stopping of the oscillator circuit.

In another embodiment of the present invention a circuit for frequency synthesis in an integrated circuit having a delay line is also disclosed. The circuit comprises an oscillator circuit having a delay line and a delay register coupled to the delay line. The delay register stores a delay value for the delay line. A phase detector is coupled to receive an oscillator clock from the oscillator circuit and a reference clock. Finally, a control circuit is coupled to the oscillator circuit for changing the frequency synthesizer from a low frequency mode to a high frequency mode.

DETAILED DESCRIPTION OF THE DRAWINGS

Figure 1:
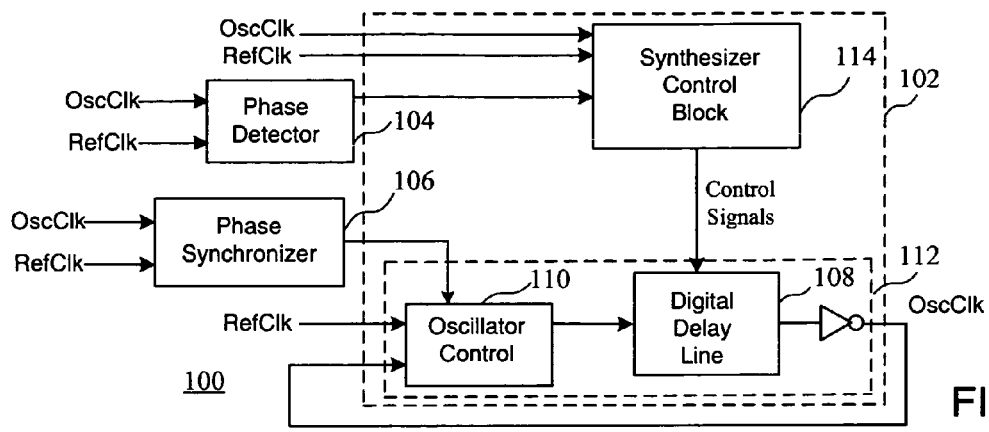
FIG. 1 is a block diagram of a circuit for generating a clock signal according to an embodiment the present invention.

Turning first to FIG. 1, a block diagram of a circuit for generating a clock signal according to an embodiment the present invention is shown. The block diagram of FIG. 1 generates a clock signal OscClk based upon a reference input clock signal RefClk. The generated clock signal OscClk is generated by clock generator 102 in response to a phase detector 104 and a phase synchronizer 106. As will be described in more detail in reference to FIG. 2, clock generator 102 could comprise a digital delay line 108 which is coupled to receive the output of an oscillator control circuit 110 of the oscillator circuit 112 and controlled by a synthesizer control block 114, both of which will be described in more detail below. The digital delay line could be, for example, a counter-controlled delay line, as will be described in more detail in reference to FIGS. 16 and 17. The digital delay line 108 is controlled by a synthesizer control block 114, which will be described in more detail in reference to FIG. 3. The oscillator frequency is determined by the clock generator 102, but even with coarse and fine selection of the delays for the digital delay line, the clock generator will not maintain a precise frequency without some correction. Clock generator 102 could be implemented as described by Logue in U.S. Pat. No. 6,384,647, the entire patent of which is incorporated by reference. The clock generator of U.S. Pat. No. 6,384,647 is controlled by both a phase detector and a phase synchronizer, where the phase synchronizer periodically replaces the generated clock signal OscClk as it oscillates through the phase synchronizer with the reference clock signal RefClk in order to perform hard phase alignment.

Figure 2:
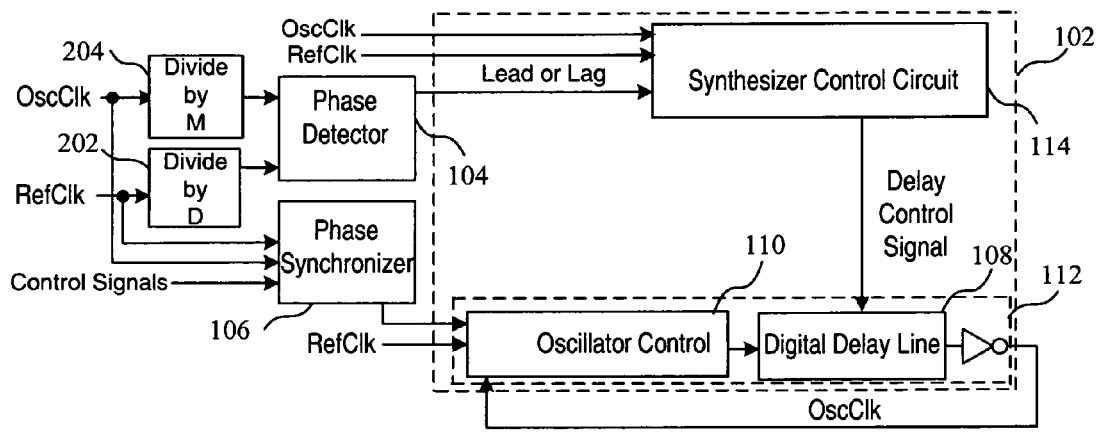
FIG. 2 is a block diagram of a circuit for synchronizing a clock signal to a reference clock signal according to an embodiment of the present invention.

In order to generate the desired clock frequency OscClk, reference clock signal RefClk is applied to a Divide-by-D circuit 202, as is shown in FIG. 2. An output signal of Divide-by-D circuit 202 is received by phase detector 104, which also receives a signal from a Divide-by-M circuit 204, and causes clock generator 102 to generate an output signal OscClk which is a multiple of M/D of the RefClk signal. Phase detector 104 provides a phase detection signal to clock generator circuit 102. The OscClk signal is applied to Divide-by-M circuit 204, which generates a divided signal applied to phase detector 104. Phase detector 104 compares its two input signals and applies a signal that guides clock generator 102 to adjust the frequency of the generated clock signal OscClk toward the desired frequency. The desired frequency of the clock generator can be achieved by feeding back a delayed clock signal from clock generator 102 through an inverter to phase synchronizer 106 to form an oscillator. When the frequency is not correct, it is adjusted in the direction dictated by the phase detector 104, which is discussed in detail below in connection with FIG. 5.

Figure 3:
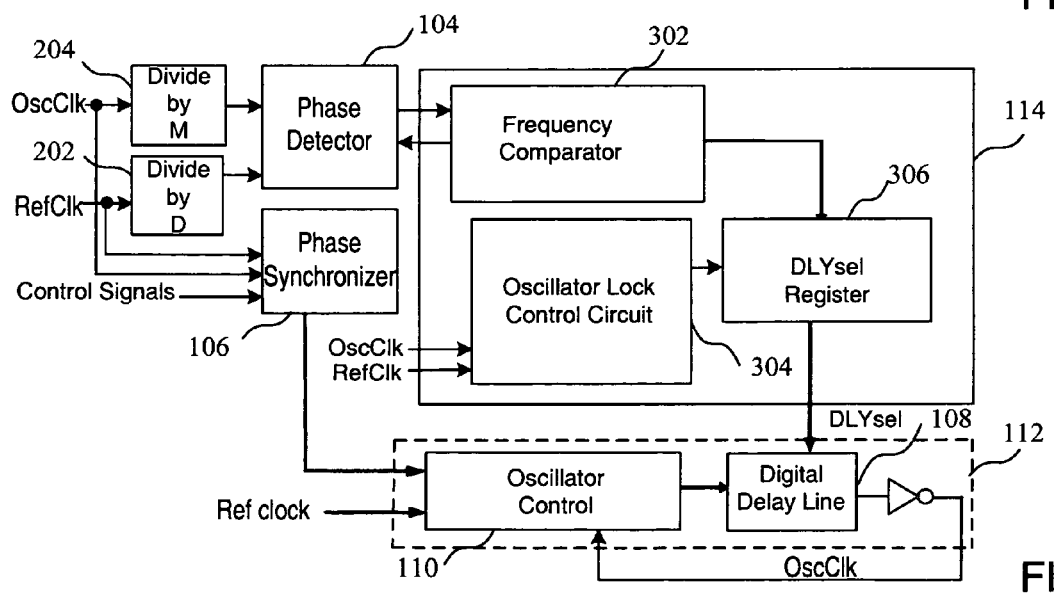
FIG. 3 is a block diagram of a circuit for synchronizing a clock signal to a reference clock signal according to an alternate embodiment of the present invention.
Figure 10:
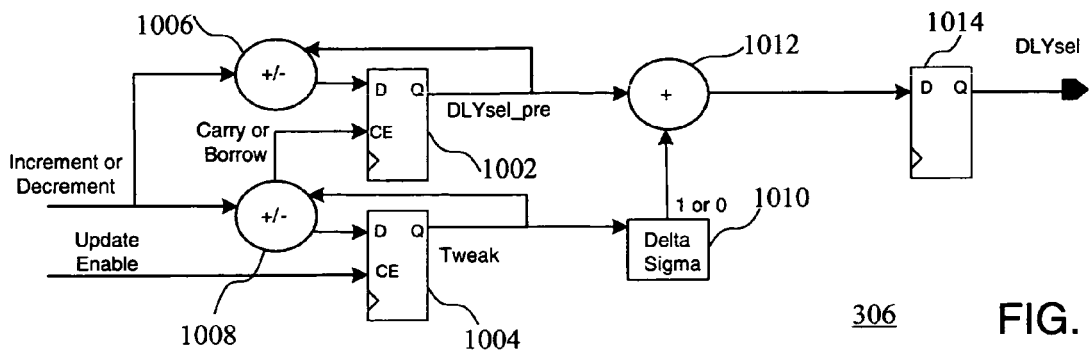
FIG. 10 is a circuit for adjusting a delay value of a delay line according to an embodiment of the present invention.

As shown in FIG. 3, the synthesizer control block includes circuits for controlling the delay of the digital delay line 108. A frequency comparator 302 generally comprises M and D counters to provide for phase and frequency comparison and hard phase alignment. An oscillator lock control circuit 304, as will be described in more detail in reference to FIG. 6, controls the original frequency acquisition of the frequency synthesizer by controlling the running of the digital delay line 108. A delay select register 306, which will be described in more detail in reference to FIG. 10, provides a DLYsel signal to the digital delay line 108. The frequency comparator couples an increment or decrement signal to the delay select register 306. The oscillator control circuit 110 recieves a run oscillator (RunOsc) signal to start and stop the oscillator as will be described in more detail in FIG. 11.

Figure 4:
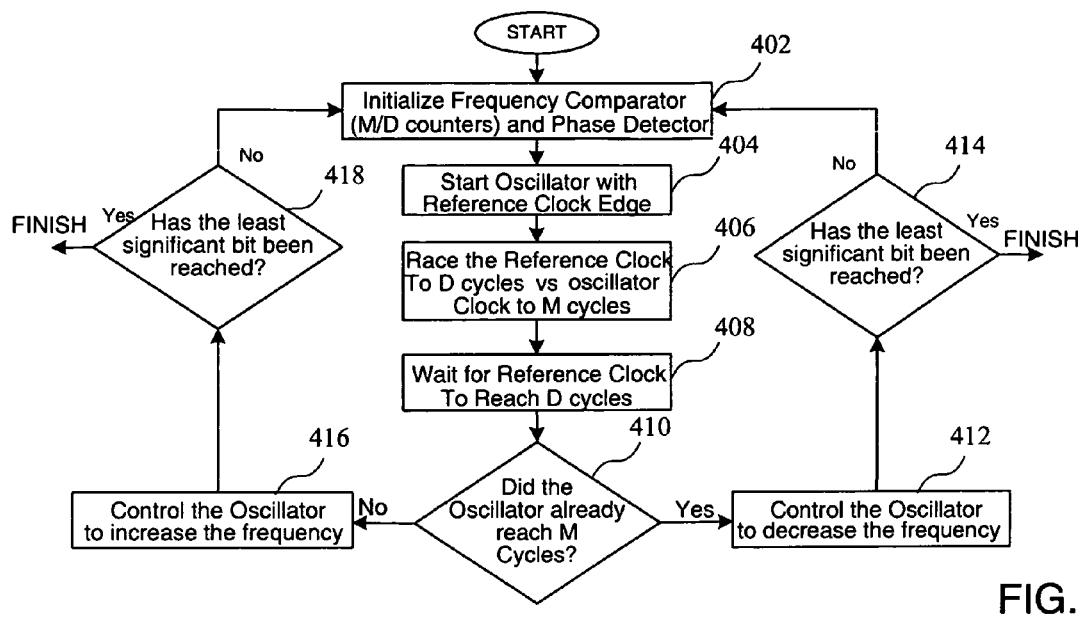
FIG. 4 is a flow chart showing steps for determining the rate of an oscillator relative to a reference clock according to an embodiment of the present invention.

Turning now to FIG. 4, a flow chart shows steps for adjusting an oscillator frequency according to an embodiment of the present invention. In particular, a frequency comparator and phase detector of a frequency synthesizer are initialized at a step 402. An oscillator is started with a reference clock edge at a step 404. The reference clock is then raced against the oscillator clock to determine if the reference clock reaches D cycles before the oscillator clock reaches M cycles at a step 406. After the reference clock reaches D cycles at a step 408, it is determined whether the oscillator had already reached M cycles at a step 410. If so, the oscillator is controlled to decrease the frequency of the oscillator at a step 412, and it is determined whether the least significant bit of a frequency control signal has been reached at a step 414. If the least significant bit has not been reached, the comparators and the phase detector are again initialized at the step 402. If the oscillator had not already reached M clock cycles at step 410, the oscillator is controlled to increase the frequency of the oscillator at a step 416, and it is determined whether the least significant bit has been reached at a step 418. If the least significant bit has not been reached, the comparators and the phase detector are again initialized at the step 402. A circuit for detecting whether the reference clock has reached D cycles before the oscillator clock has reached M cycles will be described in FIG. 5, while a method of controlling the oscillator based upon this determination will be described in more detail in reference to FIG. 6.

Figure 5:
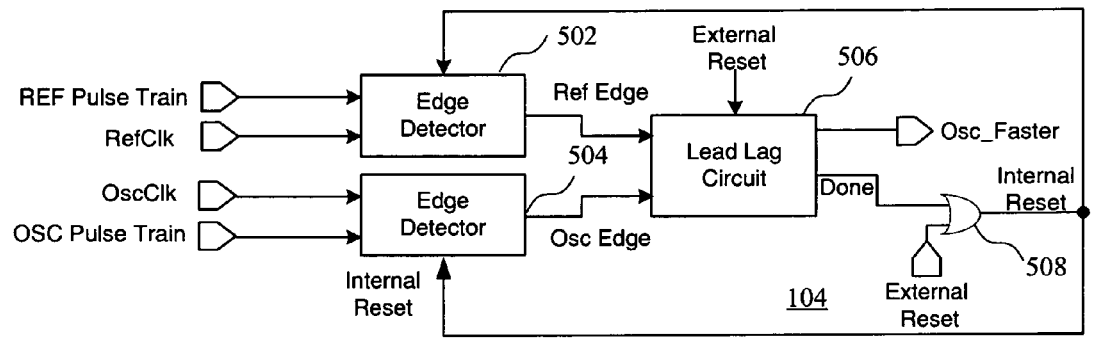
FIG. 5 is a circuit for detecting the frequency of an oscillator relative to a reference clock according to an embodiment of the present invention.

Turning now to FIG. 5, a circuit for detecting the frequency of an oscillator relative to a reference clock according to an embodiment of the present invention is shown. The phase detector 104 includes edge detector 502 for the reference pulse train and edge detector 504 for the oscillator pulse train, and a lead-lag state machine 506. Phase detector 104 is responsive to clock signal RefClk, clock signal OscClk, a concurrence signal REF Pulse Train, and a concurrence signal OSC Pulse Train. Phase detector 104 generates a control signal OSC_Faster. When clock signal OscClk is leading clock signal RefClk, an active control signal OSC_Faster is generated. Conversely, when clock signal OscClk is lagging clock signal RefClk, an inactive control signal OSC_Faster is generated. Control signal OSC_Faster may be used to guide the oscillator to produce clock signal OscClk having a frequency and phase such that clock signals OscClk and RefClk are synchronized. Concurrence signals OSC Pulse Train and REF Pulse Train act as gate signals to control the timing of phase comparisons between clock signals RefClk and Osc-Clk.

In particular, edge detector 502 is responsive to clock signal RefClk and concurrence signal REF Pulse Train. Similarly, edge detector 504 is responsive to clock signal OscClk and concurrence signal OSC Pulse Train. Edge detector 502 generates an edge detection signal REF_EDGE, and edge detector 504 generates an edge detection signal OSC_EDGE. When concurrence signal REF_EDGE is in an active state, edge detector 502 drives edge detection signal REF_EDGE to the active state when the next edge of clock signal RefClk arrives. When concurrence signal OSC_EDGE is in the active state, edge detector 504 drives edge detection signal OSC_EDGE to the active state when the next edge of OscClk arrives. The edge detectors could be configured to detect positive edges of the clock signals or negative edges of the clock signals.

Edge detectors 502 and 504 could be asynchronous level-mode sequential circuits, for example, and asynchronously detect the next edge of their respective clock signals when their respective concurrence signals are in the active state. Thus, a level-change in a clock signal and/or a concurrence signal will cause a change in state of the edge detection signal and/or one or more internal signals in a given edge detector. A Lead-lag state machine 506 is responsive to edge detection signals REF_EDGE and OSC_EDGE. Lead-lag state machine 506 preferably incorporates asynchronous level-mode sequential circuitry in order to determine which of clock signals RefClk and OscClk is leading. If an edge of clock signal OscClk is detected first, lead-lag state machine 506 drives control signal OSC_Faster to the active state. If an edge of input signal RefClk is detected, lead-lag state machine 506 drives control signal OSC_faster to the inactive state. After each phase comparison, lead-lag state machine 506 drives a reset signal INTERNAL_RESET to an active state. Reset signal INTERNAL_RESET is coupled to edge detectors 502 and 504 in order to reset edge detection signals REF_EDGE and OSC_EDGE, respectively, to an inactive state. Operation of the phase detector 104 is described in more detail in U.S. Pat. No. 6,756,822, the entire patent of which is incorporated herein by reference.

Figure 6:
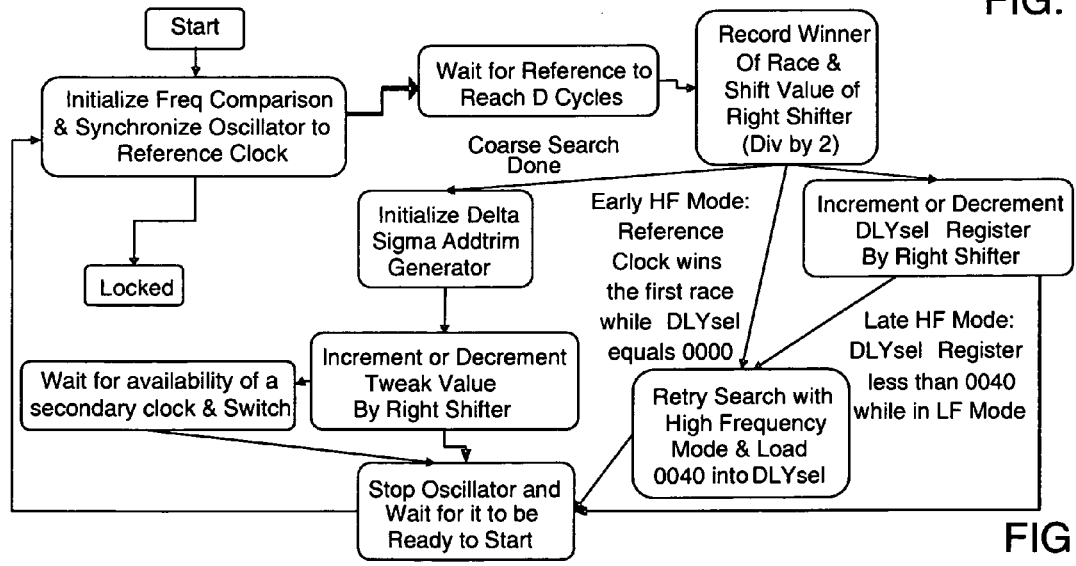
FIG. 6 is a state diagram for locking an oscillator clock to a reference clock according to an embodiment the present invention.
Figure 7:
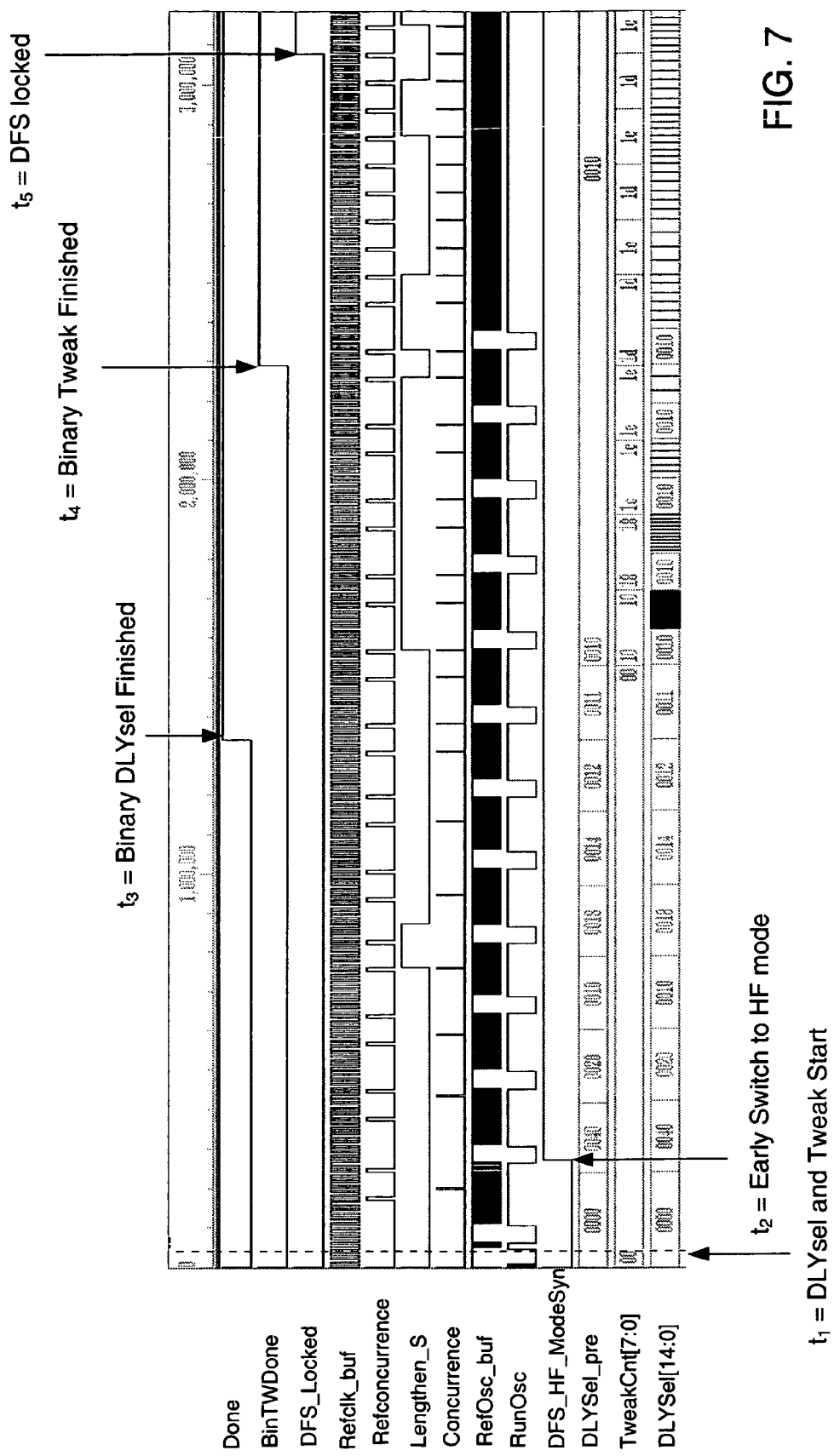
FIG. 7 is a timing diagram showing waveforms for the state diagram of FIG. 6 when an early switch to a high frequency searching mode is made according to an embodiment of the present invention.
Figure 8:
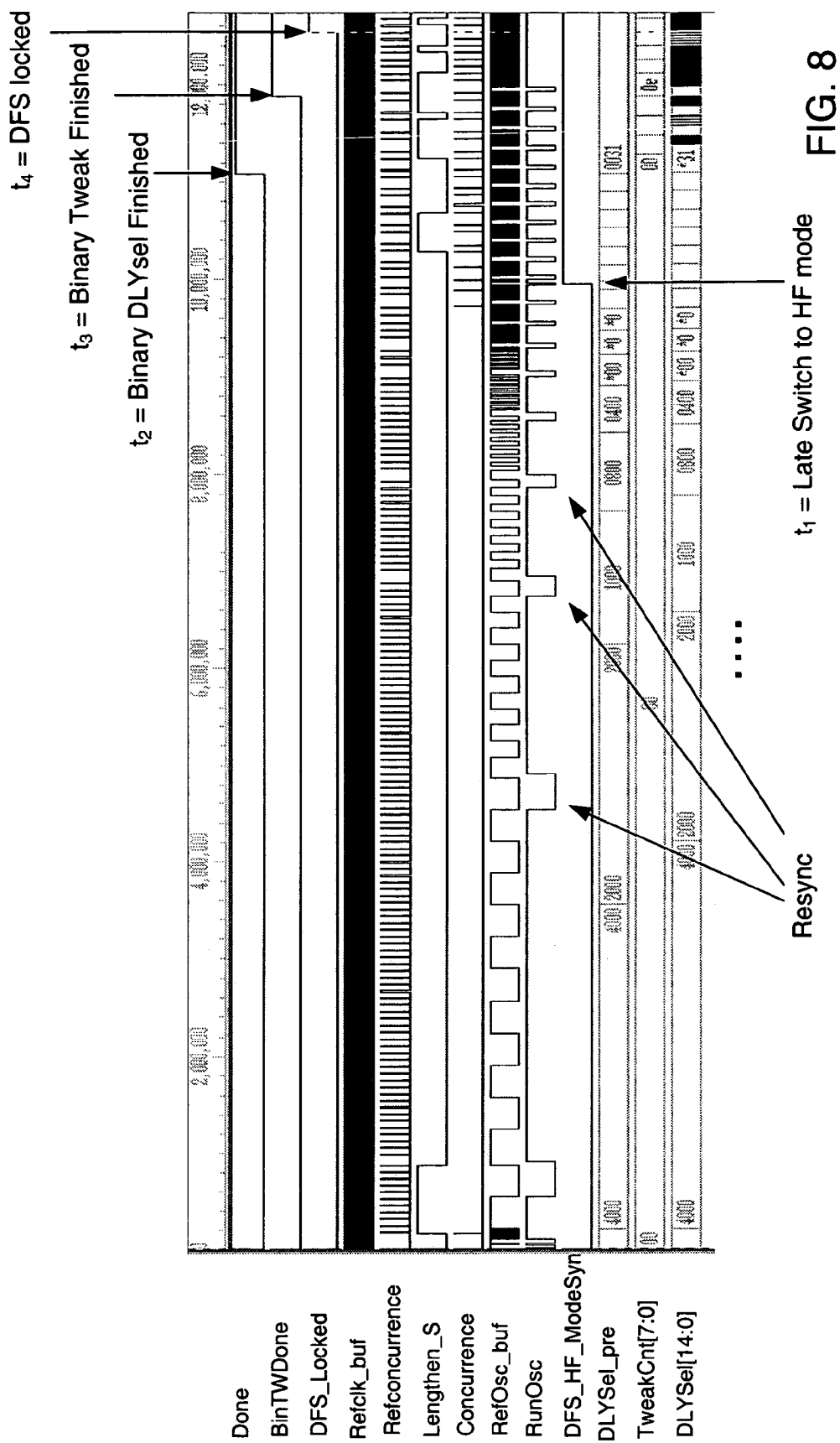
FIG. 8 is a timing diagram showing waveforms for the state diagram of FIG. 6 when an late switch to a high frequency searching mode is made according to an embodiment of the present invention.
Figure 9:
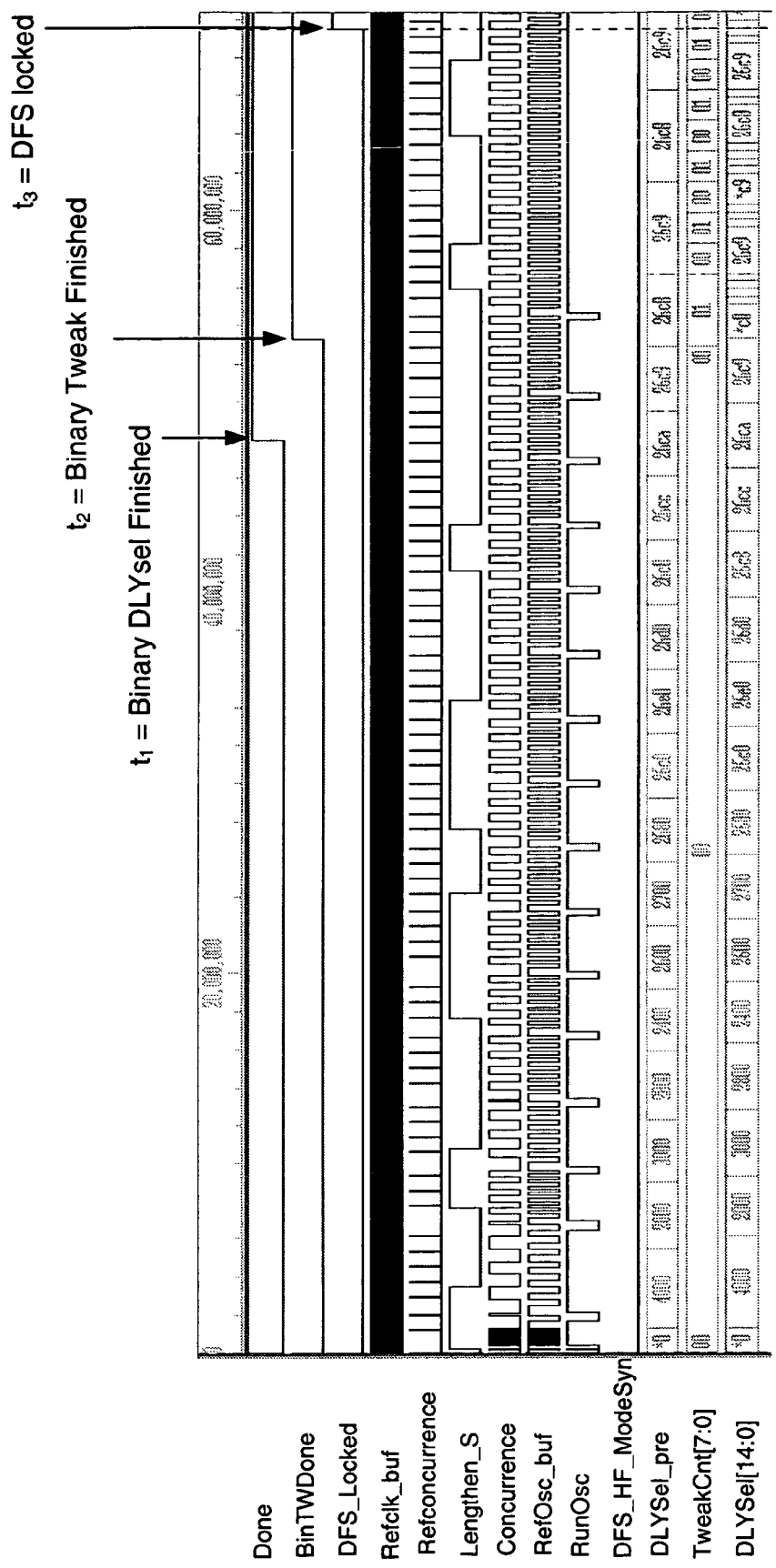
FIG. 9 is a timing diagram showing waveforms for the state diagram of FIG. 6 during a low frequency searching mode according to an embodiment of the present invention.

Turning now to FIG. 6, a state diagram enabling the oscillator lock control circuit 304 to lock the oscillator to the reference clock according to an embodiment the present invention is shown. According to one aspect of the state diagram of FIG. 6, a state machine enables the automatic shifting from a low frequency (LF) mode to a high frequency (HF) mode and without a user of the circuit being required to select a mode. Timing waveforms providing examples of the selection of a frequency mode are shown in FIGS. 7–9. Also, a circuit for selecting a delay select (DLYsel) signal, which provides both course and fine delay, is shown in FIG. 10. Circuits for generating the necessary control signals to enable the automatic switching from the LF mode to the HF mode will be described in detail in reference to FIGS. 11–15.

Finally, as will be described in more detail below, one benefit of the state machine of FIG. 6 is that it allows the binary selection of both the course and fine timing signals in a single clock domain. Accordingly, not only are the number of clock domains reduced, but the locking time for determining the fine or "Tweak" control signal values is reduced.

In an initialization state, the frequency comparators are initialized and the oscillator is synchronized to the reference clock. The state machine preferably starts in the low frequency mode, and a binary value of 0000 is loaded in the DLYsel register, which is described in reference to FIG. 10. The state machine then waits for reference clock to reach D cycles, and records the winner of the race between the reference clock and the oscillator clock as described above with respect to FIG. 4. If the reference clock initially wins the first race while the delay select register equals 0000, it is determined that the oscillator clock is too slow, and the state machine enters the HF mode early. A predetermined delay value, such as a binary 0040 in this example, is loaded into the DLYsel register, and the search is then retried in the HF Mode. After the course search is complete, either in the LF mode or HF mode, the fine control signal value is then determined. As will be described in more detail in reference to the waveforms of FIGS. 7–9 and the circuit of FIG. 10, a Delta Sigma generator is initialized after the course search is complete, and the tweak value of the circuit of FIG. 10 is incremented or decremented. The oscillator is then stopped, or the circuit waits for the availability of a secondary clock.

The early entry into the HF mode can be seen in the waveform of FIG. 7, which shows the output of a frequency synthesis circuit having received a 100 MHz input signal, and a M/D ratio of 32/7 in order to generate a 457 MHz output signal. In particular, after the initial DLYsel and Tweak searching is started at a time $t_1$, an early switch to the high frequency mode is made at a time $t_2$ after the signal to run the oscillator (RunOsc) goes low, when the reference clock wins the first race (and the delay select register equals 0000). The oscillator is stopped and the state machine waits for the oscillator to be ready to be started when RunOsc goes high again. The generation of the RunOsc signal will be described in more detail in reference to FIG. 11. Each time after RunOsc goes low, the value of the DLYsel register (DLYSel [14:0]) is incremented or decremented until the correct binary value is determined at a time $t_3$. For example, the state machine could shift the value of a right shifter to perform a divide-by-two function in a binary system, which increments or decrements the value of the DLYsel register. As can be seen, the value of the DLYsel register in this example is 0010 when the determination of the binary DLYsel is finished. The binary Tweak value (TweakCnt [7:0]) is then varied until a correct tweak value is determined (which is 1d in this example). The DLYsel value and the Tweak value could be determined when output of the phase detector begins to alternate between the RefClk and the OscClk, for example.

The timing waveform of FIG. 8 shows the output of a frequency synthesis circuit which receives a 100 MHz input signal, and has a M/D ratio of 20/7 to generate a 285 MHz output signal. As shown in FIG. 8, if the DLYsel register value remains less than a predetermined threshold (i.e. a binary value of 0040 in this example) while in the LF mode, the state machine will stop the oscillator and wait for it to be ready to start. However, when the value in the delay register equals the predetermined threshold, the state machine enters the HF mode. This late entry into late HF mode at time $t_1$ is made following numerous resynchronizing steps after the RunOsc signal has gone low and the value in the DLYsel register has been decremented. After the DLYsel value determination is finished at a time $t_2$, the determination of the binary Tweak value is also performed. After the tweaking is finished at time $t_3$, the digital frequency synthesizer locks at time $t_4$. In some cases, the state machine never switches to the HF mode as shown in FIG. 9, but stays in the LF mode. The waveforms shown in FIG. 9 are based upon a frequency synthesis circuit receiving a 25 MHz input signal, and has a M/D ratio of 2/20 to generate a 2.5 MHz output signal. Accordingly, as can be seen in FIGS. 7–9, the state machine enables automatic frequency range selection without user intervention, and provides a full binary frequency search which leads to faster lock for higher multiply values.

Turning now to FIG. 10, a circuit for adjusting the course and fine delay of a delay line as described in the state diagram of FIG. 6 is shown. The delay select counter 306, which holds the digital representation of the oscillator period, comprises a delay select register 1002 and a tweak register 1004. The delay select register and tweak register receives an addition or subtraction signal at an adder/subtractor circuit, 1006 and 1008, respectively. The update enable signal is a clock enable for the tweak register, and a carry or borrow signal is a clock enable signal for the delay select register. The update magnitude is an addition or subtraction (+1 or −1) depending on the input error signal. An output of the tweak register is also coupled to the adder/subtractor circuit 1008, and a delta sigma circuit 1010. The output of the tweak register could be, for example, the least significant bits of the clock period selection signal. Finally, an adder 1012 adds the output of the delay select register signal (DLYSel_pre) and the output of the delta sigma circuit, and couples the sum to a register 1014 which generates the DLYsel signal. Accordingly, the circuit of FIG. 10 enables the generation of the DLYsel signal in a single binary frequency search.

Figure 11:
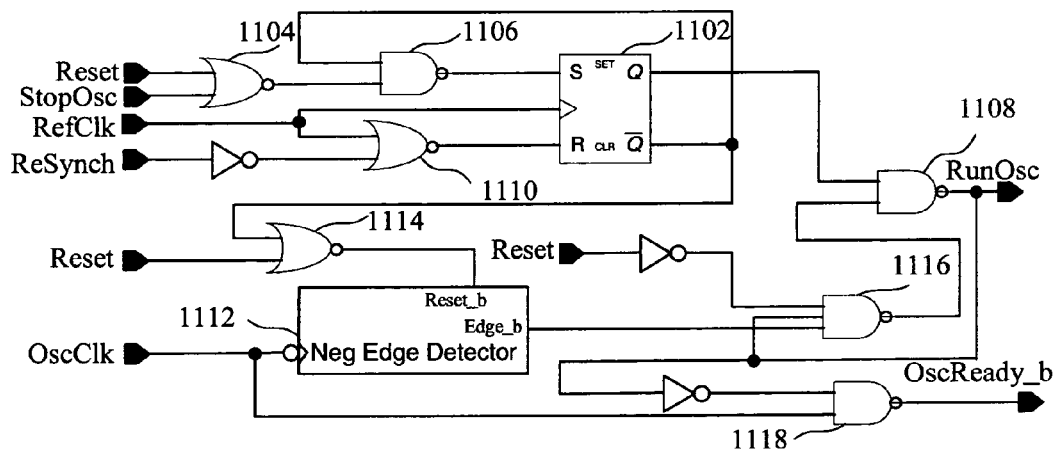
FIG. 11 is a block diagram of a circuit for controlling an oscillator based upon the state diagram of FIG. 6 according to an embodiment the present invention.

Turning now to FIG. 11, a block diagram of a circuit for controlling the oscillator circuit by generating signals to start and stop the oscillator based upon the state diagram of FIG. 6 is shown. The circuit of FIG. 11 could be implemented for example in the phase synchronizer 106. A register 1102 is responsive to a Reset signal or a StopOsc signal coupled to an input of a NOR gate 1104. When a high Reset signal or StopOsc signal is received at a NOR gate 1104, a low output of NOR gate 1104 is coupled to an input of a NAND gate 1106, driving the high input to the register 1102. The StopOsc signal is intended to stop the oscillator as described in the state diagram of FIG. 6 and the timing waveforms of FIGS. 7–9. The output of the register 1102 is coupled to a NAND gate 1108 which generates a RunOsc signal which is used to start or stop the oscillator (based upon a StopOsc signal generated in the circuit of FIG. 12). As will be described in more detail in reference to a timing diagram of FIG. 15, the RunOsc signal stops and starts the oscillator to enable synching to the RefClk. Because the register 1102 is coupled to receive the RefClk, the RunOsc signal is generated in the RefClk domain. The reset terminal of the register 1102 receives the output of a NOR gate 1110, which receives an inverted ReSync signal and the RefClk at its inputs.

NAND gate 1108 also receives an input from the lower half of the circuit comprising a negative edge detector 1112 which is clocked by the OscClk. The negative edge detector receives an output of a NOR gate 1114, which is coupled to receive the inverted output of the register 1102 at a first input and a Reset signal at a second input. The output of the negative edge detector is coupled to a NAND gate 1116, which also receives an inverted Reset signal and the RunOsc signal. The output of the NAND gate 1116 is also coupled to the NAND gate 1118 for generating the RunOsc signal. Finally, a NAND gate 1118 is coupled to receive an inverted RunOsc signal and the OscClk signal to generate an OscReady_b. Accordingly, the circuit of FIG. 11 provides the benefit of generating the oscillator control signal RunOsc in the reference clock domain, thereby reducing the required clock domains compared to conventional devices. The functions of the various signals received or output by the circuit of FIG. 11 will be described in more detail in reference to the timing diagram of FIG. 15.

Figure 12:
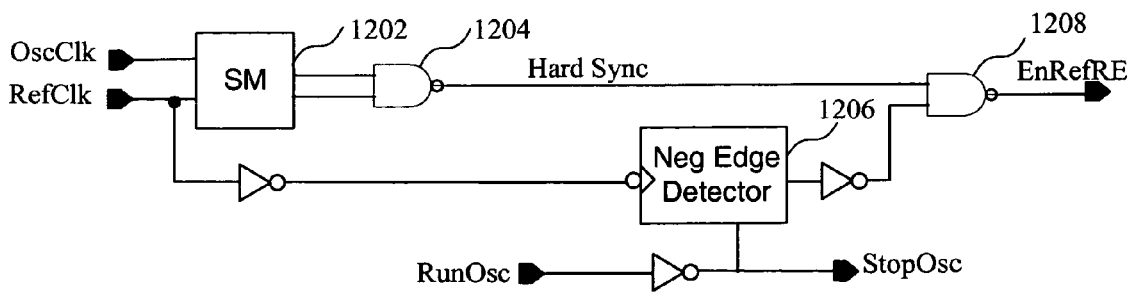
FIG. 12 is a block diagram of a circuit for providing phase synchronization according to an embodiment of the present invention.

Turning now to FIG. 12, a block diagram of a circuit for providing phase synchronization according to an embodiment of the present invention is shown. The circuit of FIG. 12, which could be employed in the oscillator control circuit 110, is used to start or stop the oscillator according to the state diagram of FIG. 6 and provide hard phase alignment after the oscillator is synchronized as will be described in more detail below. The RefClk and OscClk signals are coupled to a state machine 1202, described in more detail in FIG. 13. The state machine is coupled to a NAND gate 1204. The output of the NAND gate 1204, comprising a Hard Sync signal, will also be described in more detail in reference to FIG. 13. The output of the NAND gate and an inverted output of a Negative Edge Detector 1206 are coupled to a NAND gate 1208, which outputs an enable reference rising edge (EnRefRE) signal. In particular, the negative edge detector 1206, which is enabled by an inverted RunOsc signal, receives an inverted RefClk signal. An inverted RunOsc signal is generated as the StopOsc signal, which is used to start and stop the oscillator according to the state diagram of FIG. 6. The function of the EnRefRE signal output by NAND gate 1208 will be described in more detail in reference to FIGS. 13 and 14.

Figure 13:
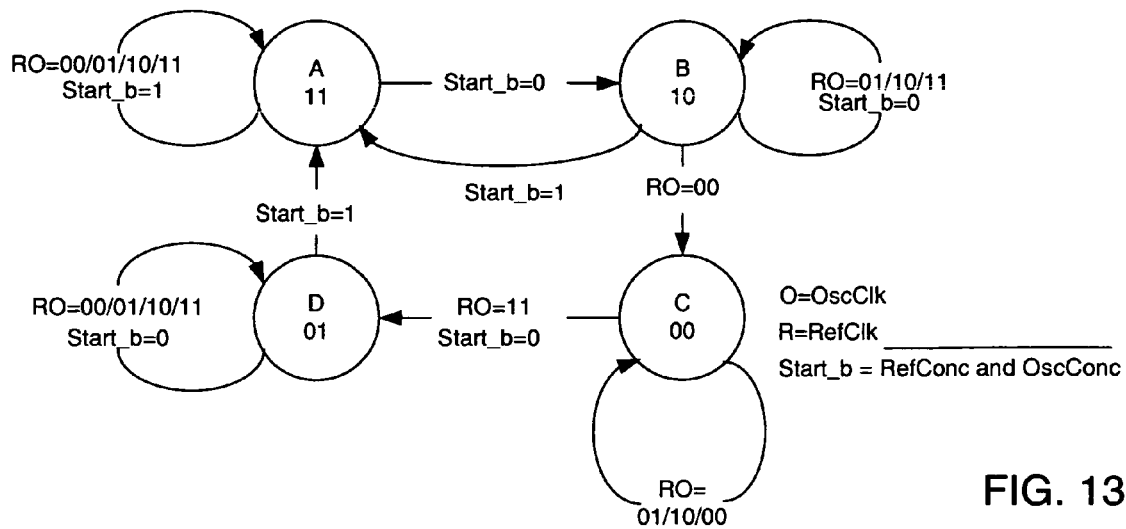
FIG. 13 is a state diagram for a state machine 1202 of FIG. 12 according to an embodiment of the present invention.

Turning now to FIG. 13, a state diagram of a state machine 1202 of FIG. 12 according to an embodiment of the present invention is shown. The state machine 1202 of FIG. 13 has four states A, B, C, and D, where R represents the RefClk and 0 which represents the OscClk, and are the outputs of the state machine coupled to the NAND gate 1204 of FIG. 12. State A occurs when RefClk and OscClk are not expected to be in concurrence. In state A, the Start_b signal is inactive (i.e. a logic high). When Start_b goes low, the state machine moves to state B, where the states of RefClk and OscClk are checked. As shown in FIG. 13, as long as either of RefClk or OscClk are logic 1 (high) and the Start_b signal remains active (logic 0), the state machine waits in state B. When both RefClk and OscClk go low, if Start_b is still active (low), the state machine moves to state C, where hard phase alignment is performed by generating a Hard Sync signal. This alignment occurs when the edge of RefClk goes high. When both of RefClk and OscClk have gone high (which means hard phase alignment has been achieved successfully), the state machine moves to state D, where it remains until the Start_b signal goes inactive (high) indicating concurrence is ended. The state machine then returns to state A to wait for another concurrence between edges of RefClk and OscClk, at which time hard phase alignment is repeated. Additional information regarding the generation of a Hard Sync signal can be found in U.S. Pat. No. 6,838,918, the entire patent of which is incorporated by reference.

Figure 14:
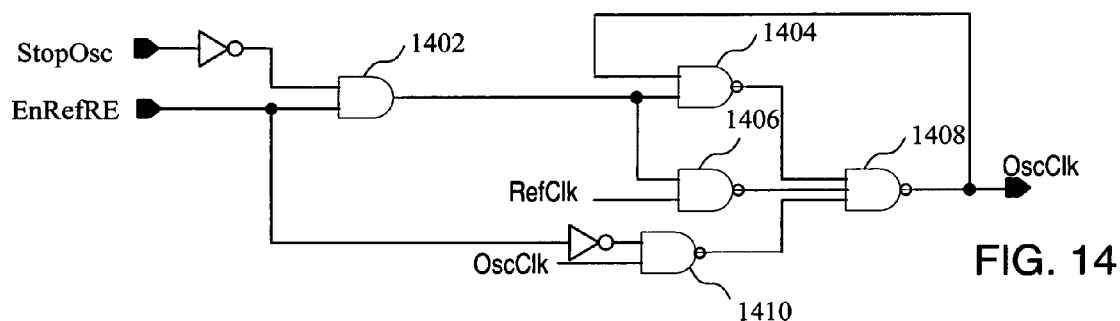
FIG. 14 is a circuit diagram for generating a rising edge of an oscillator signal for phase synchronization according to an embodiment of the present invention.

Turning now to FIG. 14, a circuit diagram for generating a rising edge of an oscillator signal for phase synchronization using hard phase alignment according to an embodiment of the present invention is shown. In particular, the EnRefRE signal and StopOsc signal are coupled to an AND gate 1402, an output of which is coupled a NAND gate 1404 and a NAND gate 1406. The output of NAND gate 1404 is coupled to a NAND gate 1408, the output of which is also coupled back to the input of NAND gate 1404. NAND gate 1408 also receives the output of NAND gate 1406, which is also coupled to receive the RefClk. Finally, a NAND gate 1410 receives an inverted EnRefRE signal at a first input, and the OscClk at a second input. The output of NAND gate 1410 is coupled to an input of NAND gate 1408. Accordingly, when the oscillator is not stopped and a high EnRefClk is received from the circuit of FIG. 12, a high output is generated for the rising edge of the oscillator clock depending upon the relative states of the reference clock or the oscillator clock.

Figure 15:
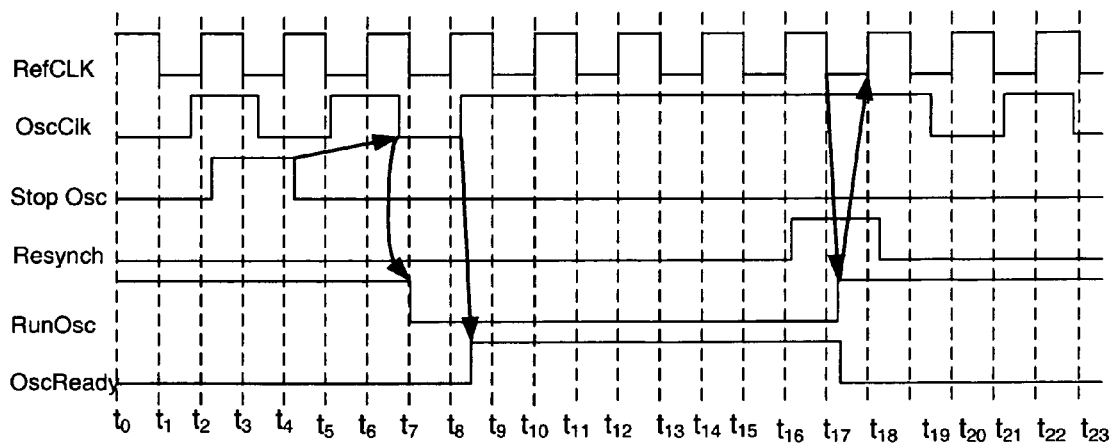
FIG. 15 is a timing diagram showing signals for re-synchronizing the oscillator clock to the reference clock according to an embodiment of the present invention.

Turning now to FIG. 15, a timing diagram shows signals for re-synchronizing the oscillator clock to the reference clock according to an embodiment of the present invention. In particular, the first falling edge of the oscillator clock after a StopOsc signal goes low, shown in this example between time $t_6$ and $t_7$, causes the RunOsc signal to go low (as described above in reference to the circuit of FIG. 11). The oscillator is then ready to start running in response to a falling edge of the oscillator clock (after the RunOsc signal has gone low), as shown between times $t_8$ and $t_9$ and described above in reference to the lower half of the circuit of FIG. 11. After a negative clock edge of the reference clock is received (when the ReSync signal is high), as shown between $t_{17}$ and $t_{18}$, the RunOsc signal goes high. That is, the ReSync signal (which is used to generate an EnRefRE signal according to the circuit of FIG. 12) restarts the oscillator clock when RefClk and Osc-Clk are positive, as shown in FIG. 13. After initial synchronization at time $t_{18}$, the hard sync signal is generated to align the rising edge of the OscClk signal with the RefClk signal according to the state machine of FIG. 13.

Figure 16:
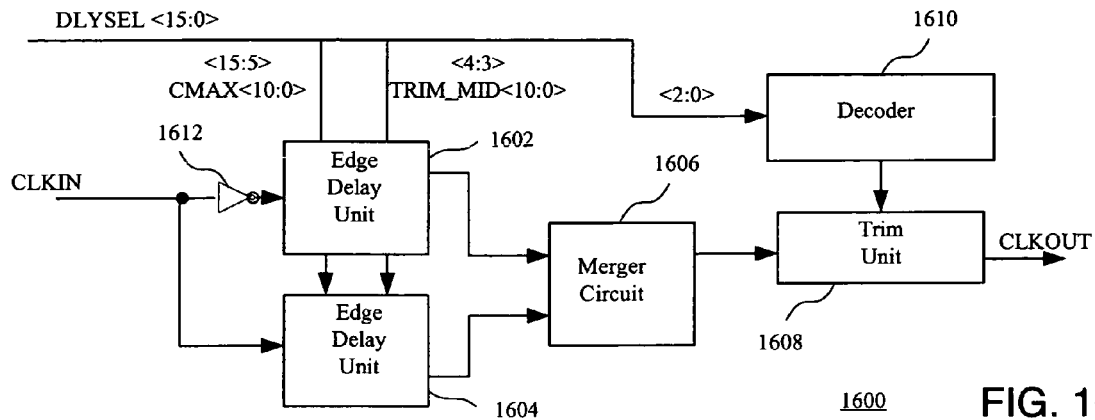
FIG. 16 is a block diagram of a counter controlled-delay line according to an embodiment of the present invention.

Turning now to FIG. 16, a block diagram of a counter controlled-delay line according to an embodiment of the present invention is shown. Counter-controlled delay line 1600, which could be implemented as delay line 108 for example, generally receives an input clock CLKIN, delays CLKIN by an amount specified by a delay select signal DLY-SEL, and provides a delayed output clock CLKOUT. Counter-controlled delay line 1600 includes two edge delay units 1602 and 1604 (each of which receives the RunOsc signal as an enable signal), a merger circuit 1606, and a trim unit 1608, which may have an internal or external decoder 1610. By way of example, DLYSEL could be a 16 bit signal DLYSEL <15:0> that is divided into three groups corresponding to three granularities for adjusting and applying delay to the input signal. Bits <15:5> of DLYSEL could be used for a coarse grain delay adjustment and provided to the edge delay units as a maximum count signal CMAX<10:0>. Bits <4:3> of DLYSEL could be used for a medium or mid grain delay adjustment and provided to the edge delay units as a mid trim signal TRIM_MID<1:0>. Bits <2:0> of DLYSEL could be used for a fine grain delay adjustment and provided to decoder 1610 for controlling trim unit 1608. While the total number of delay select bits and the number of bits at each granularity shown in FIG. 16 may be preferable in some embodiments of the invention, other embodiments may have a different number of delay select bits organized differently in the three granularities.

As will be described in greater detail in reference to FIG. 17, each of the delay units delays the rising edges of its input signal and provides output edge pulses having rising edges delayed from the rising edges of CLKIN by an amount specified by the CMAX and TRIM_MID signals. Input clock CLKIN is provided to edge delay unit 1604 to delay the rising edges of CLKIN. An inverted version of CLKIN is provided to edge delay unit 1602 via inverter 1612 to delay the falling edges of CLKIN. Edge pulses corresponding to delayed rising and falling edges are provided from edge delay units 1604 and 1602, respectively, to merger circuit 1606 for combining into a single merged delayed clock signal having delayed rising and falling edges. The merged delayed clock signal is then provided by merger circuit 1606 to trim unit 1608. Trim unit 1608 provides a fine grain delay adjustment to the combined clock signal based on the decoded delay select bits and outputs the output clock CLKOUT. Thus, the delay adjustment applied to the input clock CLKIN may be controlled at three granularities to produce a delayed output clock CLK-OUT. That is, coarse and mid grain delay may be provided by the edge delay units, and fine grain delay may be provided by trim unit 1608.

Figure 17:
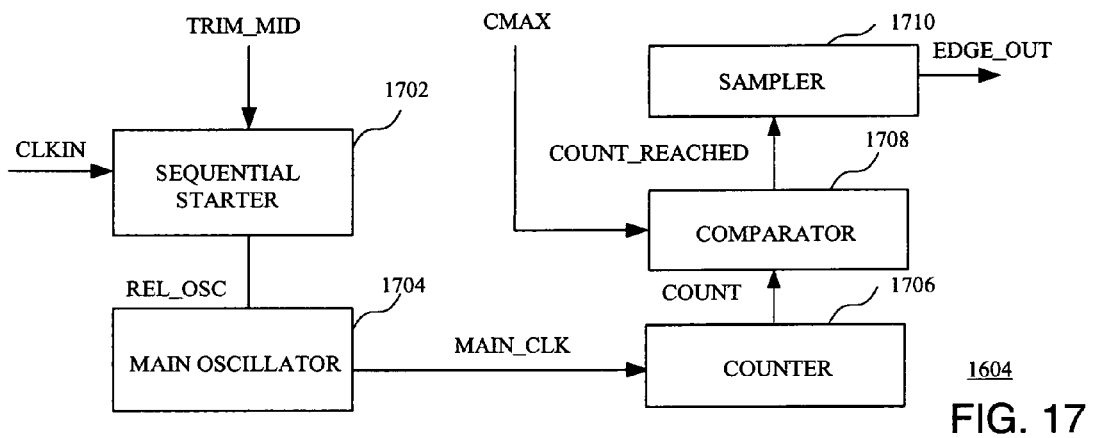
FIG. 17 is a block diagram of an edge delay unit of the counter-controlled delay line of FIG. 16 according to an embodiment the present invention.

Turning now to FIG. 17, a block diagram of an edge delay unit of the counter-controlled delay line of FIG. 16 according to an embodiment the present invention is shown. Edge delay unit 1604 includes a sequential starter circuit 1702, a main oscillator 1704, a counter 1706, a comparator 1708, and a sampler 1710. Sequential starter circuit 1702 receives input clock CLKIN and mid grain trim signal TRIM_MID, and provides a release oscillator control signal REL_OSC to main oscillator 1704. Sequential starter circuit 1702 detects rising edges of CLKIN and releases main oscillator 1704 to start oscillating when a rising edge is detected. Release oscillator control signal REL_OSC may be a multi-bit signal that provides decoded mid trim information to main oscillator 1704. As will be explained below, this mid trim information is used to adjust the phase of main oscillator 1704 and to provide a mid grain delay adjustment.

In response to the REL_OSC signal, main oscillator 1704 begins to oscillate at a predetermined frequency to produce a clock signal MAIN_CLK. Clock signal MAIN_CLK is then used to drive counter 1706. For example, counter 1706 could be an edge counter that increments at each rising and falling edge of clock signal MAIN_CLK, or only increments rising edges or falling edges. The output of counter 1706, COUNT, is provided to comparator 1708. Comparator 1708 compares the current count to the maximum count CMAX value. When COUNT matches CMAX, comparator provides a COUNT_REACHED signal to sampler 1710 to indicate that the desired maximum count CMAX has been reached. Thus, counter 1706, in conjunction with main oscillator 1704 and comparator 1708, provides a coarse grain delay adjustment. For embodiments where counter 1706 is an edge counter, the size of each coarse grain delay step is equal to half the period of oscillation of clock signal MAIN_CLK from main oscillator 1704. That is, counter 1706 increments for every half-cycle of MAIN_CLK until CMAX is reached, thereby providing a total coarse delay that is equal to CMAX multiplied by one-half the period of oscillation of main oscillator 1704.

Once counter 1706 has counted CMAX edges of MAIN_CLK, comparator 1708 asserts the COUNT_REACHED signal, which is sampled by sampler 1710. When sampler 1710 detects that comparator 1708 has asserted COUNT_REACHED, it provides a rising edge for the EDGE_OUT output signal for an edge unit. By employing the Counter-Controlled delay lines, the circuit of the present invention provides an area-efficient implementation of frequency synthesis. Additional information regarding the counter-controlled delay line can be found in U.S. patent application Ser. No. 11/015,674, filed on Dec. 17, 2004 by the Assignee of the present application, the entire application of which is incorporated herein by reference. Accordingly, the circuit of the present invention provides a frequency synthesizer having improved area-efficiency, having higher frequency range towards the low end, and providing frequency aligned functionality without an area loss.

Figure 18:
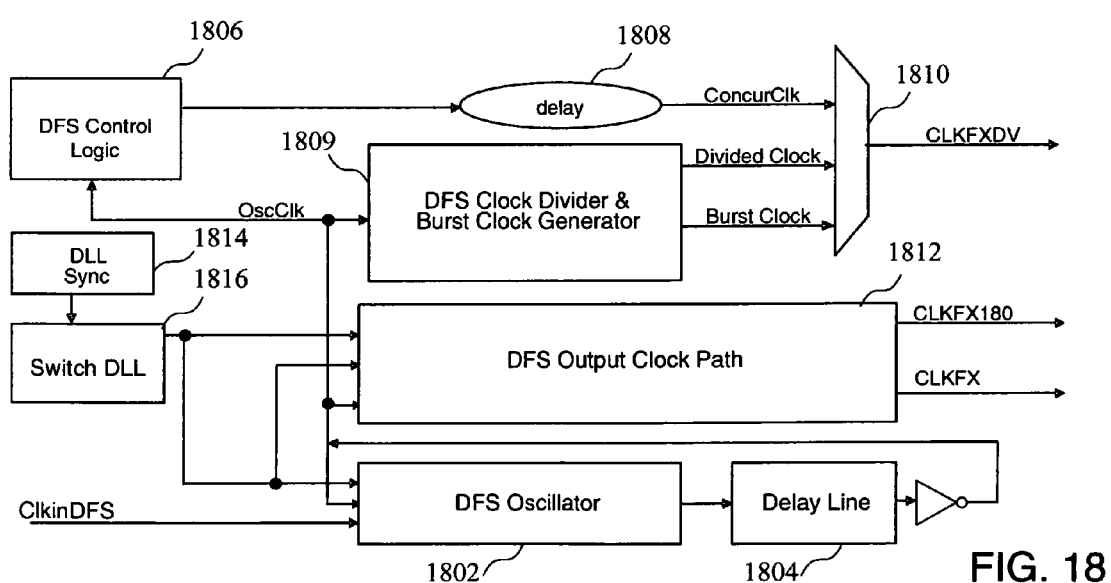
FIG. 18 is a block diagram of a circuit for generating a divided clock signal according to an embodiment of the present invention.

Turning now to FIG. 18, a block diagram of a circuit for generating a divided clock signal according to an embodiment of the present invention is shown. In particular, a digital frequency synthesis (DFS) oscillator 1802 and delay line 1804 generates an OscClk which is coupled to a DFS control logic circuit 1806. The DFS oscillator 1802 and delay line 1804 could be an oscillator and delay line described above in reference to FIGS. 2 and 3. The output of the DFS control logic circuit 1806 is coupled to a delay circuit 1808 to generate a Concurrence clock (ConcurClk) signal. The oscillator clock is also coupled to a DFS clock divider and burst clock generator 1809, which outputs a divided clock signal and a burst clock signal. The concurrence clock signal, the divided clock signal and the burst clock signal are couple to a multiplexer 1810 which outputs one of the signals as a CLKFXDV signal. Finally, the OscClk signal is coupled to a DFS output clock path 1812, which receives control signals from a DLL Sync circuit 1814 and a Switch DLL circuit 1816 to generate a CLKFX signal and a CLKFX180 signal. Although the circuit of FIG. 18 provides one example of a circuit for generating a divided clock signal based upon a frequency synthesized signal according to the circuits of the present invention, it should be understood that other clock divider circuits could be employed.

It can therefore be appreciated that the new and novel method of and circuit for frequency synthesis has been described. It will be appreciated by those skilled in the art that numerous alternatives and equivalents will be seen to exist which incorporate the disclosed invention. As a result, the invention is not to be limited by the foregoing embodiments, but only by the following claims.

The invention claimed is:

1. A circuit for frequency synthesis in an integrated circuit having a delay line, said circuit comprising:
an oscillator circuit having a counter-controlled delay line, said oscillator circuit coupled to receive a reference clock and generate an oscillator clock;
a delay register coupled to said counter-controlled delay line, said delay register storing a delay value for said counter-controlled delay line; and
a phase synchronizer circuit coupled to said oscillator circuit, said phase synchronizer circuit controlling the starting and stopping of said oscillator circuit to enable locking said oscillator circuit to a desired oscillator clock frequency,
wherein said phase synchronizer circuit stops said oscillator circuit after a comparison of a frequency of said oscillator clock and a frequency of said reference clock to enable switching between a low frequency mode and a high frequency mode for locking said oscillator circuit to said desired oscillator clock frequency based upon said comparison, said low frequency mode and said high frequency mode being selected based upon said frequencies of said reference clock and said oscillator clock.

2. The circuit of claim 1 further comprising a phase detector coupled to said oscillator circuit, said phase detector controlling said oscillator clock frequency.

3. The circuit of claim 1 further comprising a control circuit coupled to said delay register, said control circuit changing said circuit from said low frequency mode to said high frequency mode.

4. The circuit of claim 1 wherein said delay register comprises a delay select register coupled to provide coarse adjustment of said delay value.

5. The circuit of claim 4 wherein said delay register comprises a tweak register to provide fine adjustment of said delay value.

6. The circuit of claim 5 wherein said delay register provides coarse and fine adjustment of said delay value based upon a single frequency search step.

7. The circuit of claim 1 further comprising an oscillator control circuit coupled to said counter-controlled delay line, said oscillator control circuit enabling hard phase alignment.

8. A circuit for frequency synthesis in an integrated circuit having a delay line, said circuit comprising:
an oscillator circuit having a delay line and generating an oscillator clock signal based upon a reference clock signal;
a delay register coupled to said delay line, said delay register storing a delay value for said delay line;
a phase detector coupled to receive said oscillator clock signal from said oscillator circuit and said reference clock signal; and
a control circuit coupled to said delay register, said control circuit changing said circuit for frequency synthesis from a low frequency mode to a high frequency mode for locking said oscillator circuit to an oscillator clock frequency based upon the output of said phase detector and a comparison of frequencies of said reference clock sicinal and said oscillator clock sicinal, said low frequency mode and said high frequency mode being selected based upon said frequencies of said reference clock signal and said oscillator clock signal.

9. The circuit of claim 8 further comprising a phase synchronizer circuit for generating a signal to run said oscillator circuit.

10. The circuit of claim 9 wherein the signal to run said oscillator circuit is based upon said reference clock.

11. The circuit of claim 10 further comprising a signal indicating that said oscillator circuit is ready to run, said signal indicating that said oscillator circuit is ready to run being generated based upon said oscillator clock.

12. The circuit of claim 8 wherein said delay register comprises a delay select register coupled to provide coarse adjustment of said delay value and a tweak register to provide fine adjustment of said delay value, said delay register providing coarse and fine adjustment of said delay value based upon a single frequency search step.

13. The circuit of claim 8 wherein said delay line comprises a counter-controlled delay line.

14. The circuit of claim 8 further comprising a clock divider coupled to the output of said oscillator circuit, said clock divider generating a divided oscillator clock signal.

15. A circuit for frequency synthesis in an integrated circuit having a delay line, said circuit comprising:
oscillator means for generating an oscillator clock, said oscillator means comprising a delay line;
delay register means coupled to said oscillator means for storing a delay value for said delay line;
phase detector means coupled to receive said oscillator clock from said oscillator means and a reference clock; and
control circuit means coupled to said delay register means, said control circuit means changing said circuit for frequency synthesis from a low frequency mode to a high frequency mode for locking to an oscillator clock frequency after a comparison of frequencies of said reference clock and said oscillator clock, said low frequency mode and said high frequency mode being selected based upon said frequencies of said reference clock and said oscillator clock.

16. The circuit of claim 15 further comprising phase synchronizer means coupled to said oscillator means for synchronizing the phase of said oscillator clock with said reference clock.

17. The circuit of claim 15 further comprising means for generating a control signal for starting and stopping said oscillator means, said means for generating coupled to said oscillator means.

18. The circuit of claim 15 further comprising means for enabling hard frequency alignment coupled to said delay line.

19. The circuit of claim 15 wherein said delay line comprises a counter-controlled delay line means, said counter-controlled delay line means comprising a first edge delay unit, a second edge delay unit, and a merger circuit.

20. The circuit of claim 15 further comprising clock divider means coupled to said oscillator means for generating a divided clock signal.

* * * * *